(12) United States Patent
Jorgensen et al.

(10) Patent No.: US 7,643,640 B2
(45) Date of Patent: Jan. 5, 2010

(54) SYSTEM AND METHOD FOR DESIGNING SOUND SYSTEMS

(75) Inventors: Morten Jorgensen, Southborough, MA (US); Michael C. Monks, Acton, MA (US); Lisa Debettencourt, Lowell, MA (US); Matthew Douglas, Natick, MA (US); Thomas Birkle, Boulder, CO (US); Christopher B. Ickler, Sudbury, MA (US); Kenneth Dylan Jacob, Framingham, MA (US)

(73) Assignee: Bose Corporation, Framingham, MA (US)

( * ) Notice: Subject to any disclaimer, the term of this patent is extended or adjusted under 35 U.S.C. 154(b) by 906 days.

(21) Appl. No.: 10/964,421

(22) Filed: Oct. 13, 2004

(65) Prior Publication Data

US 2006/0078130 A1  Apr. 13, 2006

(51) Int. Cl.
  *H03G 3/00* (2006.01)
  *G10H 7/00* (2006.01)
  *G06F 17/00* (2006.01)
  *G06G 7/62* (2006.01)
  *H04R 29/00* (2006.01)

(52) U.S. Cl. .............. 381/61; 381/62; 381/63; 381/56; 84/615; 84/609; 84/662; 84/626; 700/94; 703/17

(58) Field of Classification Search ............ 381/61–63, 381/56–59; 84/600–609, 662, 649, 615, 84/626; 700/94; 703/2, 17
See application file for complete search history.

(56) References Cited

U.S. PATENT DOCUMENTS

| | | | | |
|---|---|---|---|---|
| 5,212,733 | A | * 5/1993 | DeVitt et al. | 381/119 |
| 5,467,401 | A | 11/1995 | Nagamitsu et al. | |
| 7,146,296 | B1 | * 12/2006 | Carlbom et al. | 703/5 |
| 2003/0152237 | A1 | 8/2003 | Nielsen | |
| 2007/0294061 | A1 | * 12/2007 | Carlbom et al. | 703/2 |

FOREIGN PATENT DOCUMENTS

| | | |
|---|---|---|
| DE | 100 19 984 | 3/2001 |
| JP | 202 123262 | 4/2002 |

OTHER PUBLICATIONS

European Examination Report dated Jun. 18, 2007, issued in European Application No. 05108717.9, filed Sep. 21, 2005.
Modeler Design Program User's Manual, Version 4.3, Printed Jul. 15, 1994.

(Continued)

*Primary Examiner*—Devona E Faulk

(57) ABSTRACT

The invention is directed to a display and method for conducting sound system design. The display is configured to simultaneously show a sound system model comprising both audio components and sound environment components, a plurality of parameters and a graphic representation of a calculated sound system performance attribute. In response to receiving input from the user and without any additional user intervention, the display re-displays a newly-calculated sound system performance attribute such as, for example, a graphic representation in the sound system model of a sound path associated with a user-selected reflected sound identifier. A processor also simulates, based on the sound system configuration, the sound performance that a user would expect to hear positioned in an identified listening position of the sound system model.

24 Claims, 5 Drawing Sheets

OTHER PUBLICATIONS

Ease Manual by Acoustic Design Ahner, Berlin, Germany, Printed 2003.

Dalenback B-I et al. "Audibility of Changes in Geometric Shape Source Directivity and Absorptive Treatment Experiments in Auralization." Journal of Audio Engineering Society, Audio Engineering Society, New York, NY, vol. 41, No. 11, Nov. 1, 1993 pp. 905-913.

Chinese Office Action for Application No. 200510114014.7, dated Aug. 1, 2008, for System and Method for Designing Sound Systems.

Chinese Office Action for Application No. 200510114014.7, dated Jan. 16, 2009, for System and Method for Designing Sound Systems.

Chinese Office Action for Application No. 200510114014.7, dated Apr. 10, 2009 for System and Method for Designing Sound Systems.

Chinese Office Action for Application No. 200510114014.7, dated Jul. 24, 2009, for System and Method for Designing Sound Systems.

Extended European Examination report dated Aug. 18, 2009, issued in European Application No. 05108717.9, filed Sep. 21, 2005.

* cited by examiner

SYSTEM AND METHOD FOR DESIGNING SOUND SYSTEMS

SUMMARY OF THE INVENTION

The present invention is a system that assists sound engineers in the sound system design process. It comprises an input mechanism, processor and a display. The system aides an engineer in the process of selecting loudspeaker components, placing them in an acoustic space, orienting them, as well as determining parameters of the acoustic space such as where absorption should be placed, in order to accomplish a desired performance level. The system allows the engineer to arbitrarily specify the acoustic space in which audio components are placed, including locations of walls, dimensions, material properties, etc. Acoustic spaces may be fully or partially enclosed, or may be fully open.

The system is configured to display a sound system model made up of various components (e.g. sound system components). The model is a mathematical and visual representation of a sound system. The components of the sound system include both audio components, such as various loudspeaker components, as well as sound environment components such as walls, seats, etc. The sound system components have associated parameters on which performance attributes of the sound system model/sound system design depend. For example, audio components have parameters such as; loudspeaker type, location in space, orientation, equalization applied, etc. Sound environment components may have parameters such as coordinates specifying the physical location in space of the sound environment component, dimensions, acoustic absorption as a function of frequency, surface reflective characteristics (such as diffuse, specular, or somewhere between diffuse and specular, etc.). By changing sound system or sound environment components or parameters thereof, and observing the resulting changes to system performance attributes, a sound engineer is able to evaluate the effects of alternative sound system designs.

The various sound system components, parameters (e.g. component parameters) and associated performance attributes, are displayed in separate windows according to one embodiment of the invention. The system displays a model of the space (e.g. a sound system model, a room depicted in a large window such as a model window). Various performance attribute data (e.g. SPL for direct sound, reverberant sound, or the combination of direct and reverberant sound, or intelligibility, etc.) can be superimposed on surfaces that correspond to listening areas (e.g. scaled as a function of color) in the sound system model. Performance attributes are also depicted graphically in a separate window (e.g. an attribute window).

After the sound engineer initiates changes to the sound system components and/or component parameters (e.g. in a parameter window or the model window) without any additional action on the part of the sound engineer, the system re-calculates and re-displays the resulting changes to system performance attributes. Accordingly the sound engineer is able to quickly observe the results of sound system design choices.

In order to provide such a quick response, the system performs only partial re-calculations of equations, where the calculations performed depend on sound system components and component parameters that have changed. The system saves time by not performing calculations that only depend on sound system components and component parameters that have not changed. The system can quickly display updated performance attributes after a parameter or component is changed. Only equations that directly depend on the changed parameter or component, or that depend on the result from an equation that depends on the changed parameter or component, are updated when the change is made. This significantly reduces the number of equations that need to be updated thus speeding up the display process. To save time also, calculations or re-calculations of new sound system performance attributes are abandoned upon receipt of new user input affecting the calculations/re-calculations. The system is also configured to store multiple sound system configurations (e.g. in the form of the sound system components and/or component parameters). This provides a mechanism for conducting comparison between alternative sound system configurations.

The system is configured to predict (e.g. based on calculated estimates) the sound system's performance for various locations represented as part of the sound system model. Sound system performance is depicted in different locations or areas of the sound system model by the display of various colors, each color representing a different performance level of the sound system. For example, according to one configuration, the system represents a high direct sound level using various shades of reds and yellows and a low direct sound level using blues and greens. Accordingly, the system superimposes various shades of the colors on different areas of the sound system model according to the predicted sound level for the corresponding areas of the sound system. A legend is included to provide information for interpreting the sound system model colors.

According to an alternative embodiment of the invention, rather than simply using colors to depict the performance level, the system may be configured to show the "favorableness" of the sound system performance. In that case, desirable or undesirable conditions may exist at both the high and low ends of the scale. For example, both high and low levels of sound pressure level can be undesirable for listening. Instead of representing the high and low ends of the sound pressure level scale with a different color at each end of the sound pressure scale, the system uses one color for the desirable sound pressure level in the middle of the sound pressure level scale and a second color for the undesirable sound pressure level, at both ends of the sound pressure level scale.

One useful function the system possesses is an interactive display that couples multiple display elements (windows) together. For example, moving the cursor in the sound system model to different listening locations causes the performance attribute display to change in real time, where the displayed attribute corresponds to the location of the cursor in the room. Also, moving a cursor along the performance attribute display (e.g. a frequency response graph) can cause the color mapped performance data (or other data such as sound paths) in the room display, in response, to change in real time. This technique is useful for ease of viewing the performance data.

An example use of the interactive display function is the display of a graphic representation of a sound path on the sound system model, in the model window. A sound path is a path that sound takes from a point where it originates (i.e. at one of the loudspeakers) to the listening location. The sound may propagate directly to the listening area (referred to as direct sound), or may reflect off one or more surfaces before arriving at the listening location (referred to as reflected sound).

A representative time response may be an actual time response, or impulse response, or may be an abstraction of an actual time or impulse response, such as a "pin" display. In a "pin" display, a sound path is associated with a "pin" (e.g. reflected sound identifier) in the representative time response graph. A "pin" in the representative time response depicts the magnitude of a reflected sound (i.e. represented by the height of the pin) and the time of its arrival (i.e. shown by its position on the horizontal time axis of a graph), at the listening location. When the user selects such a pin by clicking on the pin, the sound path associated with the selected pin is highlighted on the sound system model, showing all surfaces it interacts with. This mechanism allows for quick identification, by the sound engineer, of the sound path(s) associated with such pins.

The system is configured in such a fashion as to simplify navigation between various component parameters found in the parameter window, and the associated sound system components that are visible in the model window. For example, in response to user selection of a particular component parameter, such as by clicking the particular component parameter, the system identifies the sound system component(s) associated with the selected component parameter by highlighting the associated sound system component(s) in the sound system model window. Also, in response to a user selection of a sound system component by clicking on the sound system component, the system identifies the component parameter(s) associated with the selected sound system component by highlighting the appropriate component parameter(s).

Yet another way that the system simplifies navigation is that the system is configured to translate user-initiated movement of sound system components into component parameter changes. For example, in response to a user-initiated change to the position of a wall depicted in the system model, such as by dragging the position of the wall to another location, the system changes component parameters associated with the wall (i.e. the parameters associated with the physical location of the wall in space).

In addition to graphically depicting performance attributes of a sound system, the system is configured to perform a simulation (e.g. an audible simulation, auditory playback, auralization, etc.) of the sound system, based on the sound system components and component parameters of the sound system as defined within the system model. A sound engineer can easily initiate such a simulation operation at any time. Accordingly, also, the sound engineer can designate a series of alternative sound system configuration and observation position combinations, which the system can play back one after the other (e.g. sequentially or in any order). In that way a listener and/or sound engineer can easily compare performance of the alternative sound system configuration/observation positions.

In one embodiment, the system (such as a display or a configuration processing system) is configured to simultaneously show a sound system model, a plurality of parameters and a graphic representation of a calculated sound system performance attribute. The sound system model comprises sound system components. The sound system components are comprised of audio components and sound environment components. The plurality of parameters are associated with at least one of the sound system components. The calculated sound system performance attribute depends on at least one of the plurality of parameters.

In another embodiment, the display further comprising a plurality of parameter details, wherein the parameter details comprise input options associated with the parameters.

In another embodiment, a configuration processing system simultaneously displays the sound system model, the plurality of sound system components, the plurality of parameters, and a sound system performance attribute. The sound system performance attribute depends on at least one of the plurality of parameters.

In another embodiment, the system receives input from the user and without additional user intervention, re-displays a newly-calculated sound system performance attribute, in response to the received user input. The input modifies one of: a sound system component and a parameter of the sound system component. In response to the user input received, the system re-displays, without additional user intervention, a newly-calculated sound system performance attribute.

In another embodiment, the re-displayed sound system performance attribute depends on the user input.

In yet another embodiment, calculation of the newly-calculated sound system performance attribute is performed in the background.

In another embodiment, calculation of the newly calculated sound system performance attribute of the sound system is abandoned upon reception of a new input from the user.

In yet another embodiment, in response to user-selection of a parameter, the system identifies to the user, a sound system component associated with the selected parameter.

In still another embodiment, in response to user selection of a sound system component, the system identifies to the user, a parameter associated with the selected sound system component.

In another embodiment, the sound system performance attribute comprises a representative time response having at least one reflected sound identifier.

In another embodiment, the system accepts a user selection of a reflected sound identifier and displays a graphic representation in the sound system model of a sound path associated with the selected reflected sound identifier.

In another embodiment, wherein the user input modifies a sound system component, the system translates user modification of the sound system component into a changed parameter.

In yet another embodiment, user modification to the sound system component comprises dragging the sound system component to a new location on the display screen.

In yet another embodiment, wherein the sound system model has a plurality of listening positions, the system accepts user selection of a listening position and displays a calculated sound system performance attribute associated with the selected listening position.

In still another embodiment, the sound system performance attribute comprises one of: direct sound pressure level as a function of frequency, reverberant sound pressure level as a function of frequency, intelligibility, representative time response, modulation transfer function and reverberation time.

In yet another embodiment, the system superimposes, over the model of a sound system, a colored map in which different colors of the colored map each represent a different level of favorableness of a sound system performance attribute.

In another embodiment, the system represents both high and low ends of a sound system performance attribute scale by a substantially similar color.

In another embodiment, wherein the displayed sound system performance attribute comprises a representative time response having at least one reflected sound identifier, the system overlays color mapped intelligibility data on the displayed sound system model.

In another embodiment, the system identifies, based on the color mapped intelligibility data, a location in the sound system model with poor intelligibility. Then the system accepts user selection of the location with poor intelligibility and displays, and without further action by the user, provides the representative time response associated with the selected location.

In another embodiment, for a sound system comprising a plurality of audio components and a plurality of sound environment components, each having parameters associated therewith, the system receives input data from a user, the input data comprising parameters of audio components and sound environment components, the input data specifying a sound system design, the system displays performance attribute data based on the input data, receives a change to the input data from a user and displays new performance attribute data based on the changed input data, if the change in the input data causes at least one element of an equation associated with the displayed performance attribute data to change.

In another embodiment, new performance attribute data displayed by the system is optionally abandoned upon receipt of new change to the input data from a user.

In yet another embodiment, a system (such as integrated configuration simulation device) comprises a storage device, filter, processor and an output mechanism. The storage device stores a plurality of pre-defined sound system configurations, each sound system configuration comprising sound system components and associated parameters. The filter filters an audio signal provided by an audio source, wherein the filter has coefficients associated with a pre-defined sound system configuration and wherein the coefficients determine the frequency response of the filter. The processor processes a user-initiated change to one of: a sound system component and an associated parameter. Upon receipt of the change, the processor determines a new set of coefficients. The output mechanism is configured to output a filtered audio signal, wherein the audio signal output by the output mechanism is filtered by a filter having the new set of coefficients.

In yet another embodiment, without further user interaction the new set of coefficients are determined by the processor after the user-initiated change to a parameter is processed.

In yet another embodiment, the system, further comprises a display, wherein the display displays a graphic representation of a sound system performance attribute simultaneously with the output of an audio signal by the output mechanism.

In another embodiment, the system specifies a sound system configuration comprising sound system components, simulates, based on the sound system configuration, the sound a user would expect to hear if the user were physically located in an identified listening position in a sound system model associated with the sound system configuration and without performance of additional set-up operations, plays back simulation result through an output device, for evaluation by a listener. The display comprises: 1) a model of a sound system, the sound system comprising at least one sound system component, 2) at least one parameter associated with a sound system component, and 3) a graphic representation of a sound system performance attribute.

In yet another embodiment, the system highlights a portion of the sound system model associated with the identified listening position.

In still another embodiment, the system displays a list of user-defined listening positions for which audio simulations may be performed.

In yet another embodiment, the system plays back simulation results in an order determined by the user.

In still another embodiment, the system selects an impromptu listening location in the sound system model and adds the impromptu listening location to the list of user-defined listening positions.

In another embodiment the system further comprising a display for displaying a list of user-defined listening positions for which audio simulations may be performed.

In another embodiment, the system further comprising a playback controller for playing back simulation results in an order determined by the user.

In still another embodiment, the system further comprising a selection control for selecting an impromptu listening location in the sound system model and adding the selected impromptu listening location to the list of user-defined listening positions.

BRIEF DESCRIPTION OF THE FIGURES

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
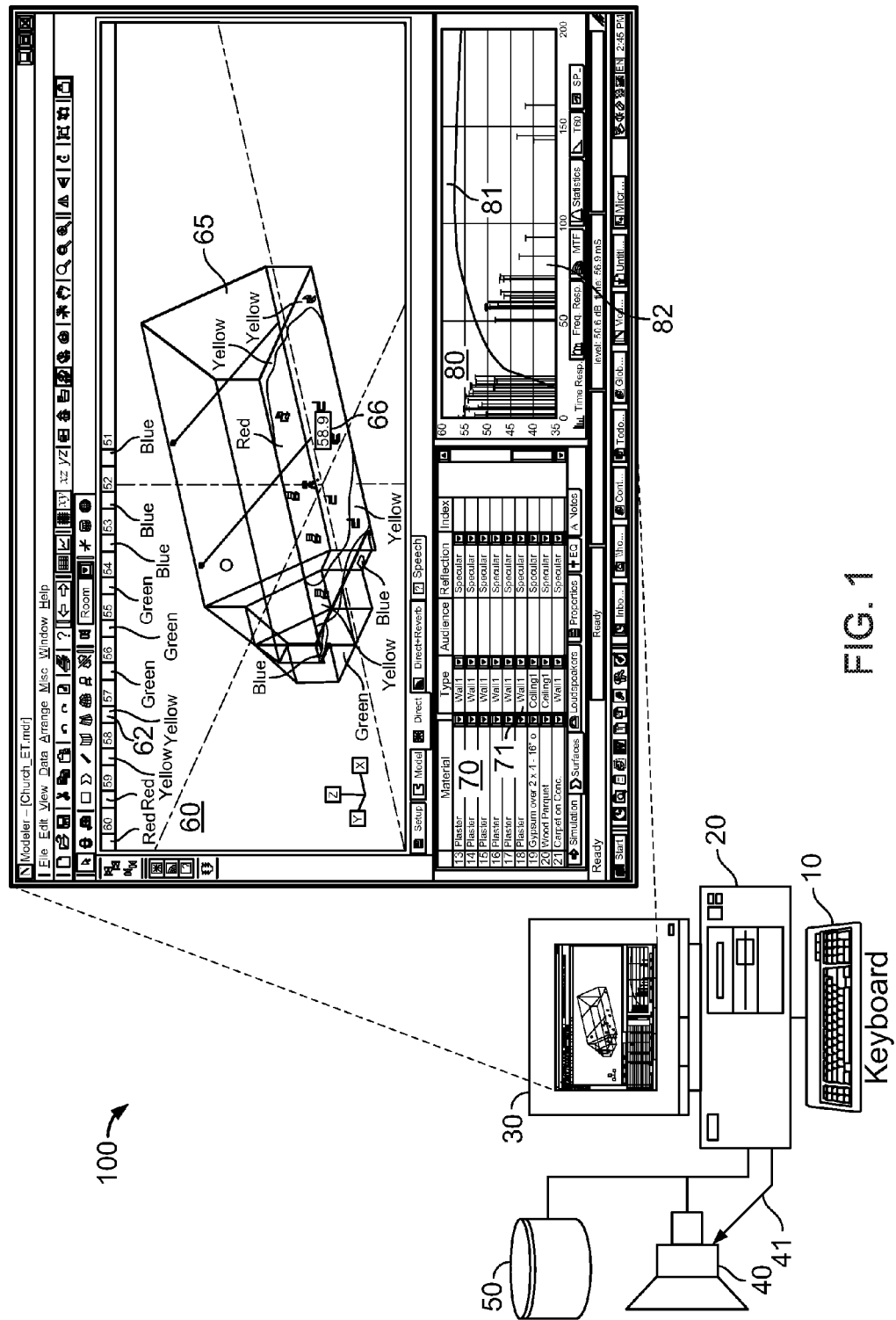
FIG. 1 is a system 100 for designing audio systems, according to one embodiment of the invention.

Referring now to the drawings, FIG. 1 is a system 100 for designing audio systems, according to one embodiment of the invention. The system 100, a configuration processor, as shown, comprises an input mechanism 10, a processor 20 for processing user input received by the input mechanism 10, a display 30, a storage device 50 for storing sound system component 65 and component parameters 71 of the sound system components 65 (e.g. the sound system components 65 and component parameters 71 effectively serve as a specification of a sound system design) and an output device 40 for outputting at least one simulated audio signal.

The display 30 displays, for example, three windows including a model of a sound system having multiple sound system components 65 in a model window 60, a second window 70, equipped to display at least one component parameter 71 in a parameter window 70, and a graphic representation of a sound system performance attribute 81 in an attribute window 80. In addition to the sound system performance attribute shown in the attribute window 80, performance attribute data (e.g. SPL for direct sound, reverberant sound, the combination of direct and reverberant sound, or intelligibility, etc.) can be superimposed (scaled as a function of color) on the sound system model. For example, FIG. 1 depicts a sound system model for a church, where the direct sound level is color mapped and superimposed over the listening area of the church. The front portion of the listening area of the church, as depicted in FIG. 1, has lower predicted direct sound level, and is color-mapped with colors for sound pressure level found at the bottom half of the sound pressure level scale i.e. greens and blues. The floor of the main section of the church has higher predicted direct sound level, and is mapped with colors for sound pressure level found at the top end of the scale i.e. reds and yellows. A legend 62 is included to provide information for interpreting the sound system model colors.

According to an alternative embodiment of the invention, rather than simply using colors to depict the sound system performance, the system may be configured to show "favorableness" of the sound system performance. In that case, it is possible for either desirable or undesirable performance to be correlated with both the high and low ends of the scale. For example, both high and low levels of sound pressure level can be undesirable for listening. Instead of representing the high and low ends of the sound pressure level scale with a different color at each end of the sound pressure scale, the system uses one color for the desirable sound pressure level in the middle of the sound pressure level scale and a second color for the undesirable sound pressure level, found at both ends of the sound pressure level scale.

A database contains all of the relevant component parameters 71 (e.g. those associated with the sound system components and those associated with the sound system model). The entire database is too large to be viewable at one time. A parameter window 70 is provided in which relevant portions of the database are displayed. A cursor is operative within the parameter window 70. It is possible to scroll throughout the database from the parameter window 70, if desired. The system 100 component parameters 71 include any of a variety of characteristics such as size, position and material composition of the various sound system components 65, for example, rear wall distance 100 ft., size 20 ft. by 50 ft., material-plaster, speaker size, position, gain, etc.

Figure 2:
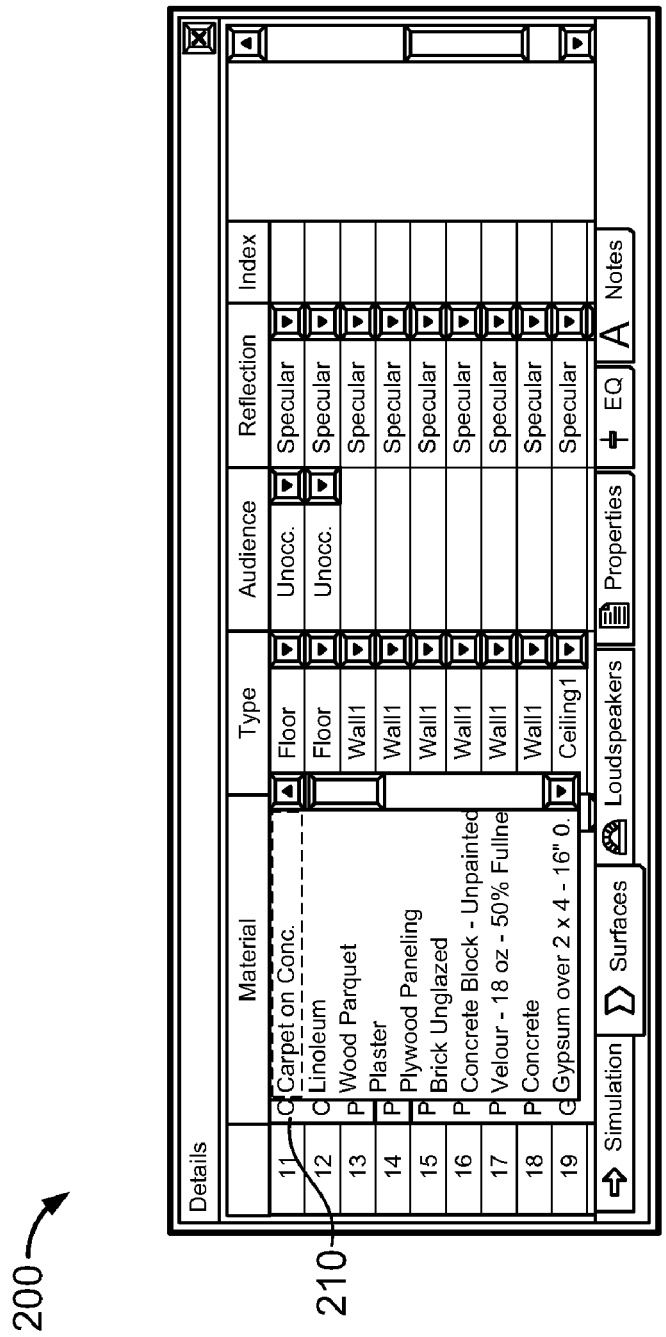
FIG. 2 shows an example of a set of parameter details, according to one embodiment of the invention.

Also related to the component parameters 71 found in the parameter window 70, are parameter details 210 (See FIG. 2) which provide input alternatives for each component parameter 71, according to one embodiment of the invention. For example, parameter details 210 for a wall may comprise: carpet, linoleum, wood parquet, plaster, plywood, paneling, etc. Parameter details 210 provide user-selectable detailed input data options for each component parameter 71.

It is possible to navigate through the component parameter 71 database by selecting a sound system component 65 within the model window 60. The component parameters 71 associated with the corresponding sound system component 65 will then be highlighted and/or displayed in the parameter database window 70. This navigation feature, provided as one embodiment of the invention, is an additional feature of the interactive display, described earlier.

Alternatively, a sound system designer, by clicking or double clicking, may select a component parameter 71 in the parameter database window 70, in order to change the component parameter 71 data. In turn, the system 100 highlights the sound system component 65 in the model window 60 associated with the selected component parameter 71. Alternatively, any components associated with parameters that are visible within the database window could be highlighted. The highlighted sound system component 65 in the model window 60 may be an element of the sound system (i.e. an audio component) or the sound environment (i.e. a room surface or element), depending on which component parameter 71 has been selected.

The attribute window 80 (e.g. by virtue of a graphic representation 81) provides a variety of graphic representations of calculated sound system performance attributes. Examples include graphs of representative time response, frequency response, modulation transfer function, and T60 (e.g. the interval of time during which sound pressure decreases by 60 dB after a steady-state sound has been abruptly shut off).

The display 30 simultaneously shows the sound system model (e.g. a three-dimensional depiction of sound system components 65), at least one component parameter 71 of the sound system components 65 and the graphical representation of sound system performance attributes in the attribute window 80. The simultaneous depiction of these three sources of information, arranged in three different windows 60, 70, 80 in FIG. 1, makes feasible almost instantaneous user evaluation of changes to a sound system configuration, enabling a more thorough evaluation of configuration options for the sound system. Other embodiments of the invention also include different combinations and/or configurations such as three separate displays/monitors configured to display the three data sources, a single display configured to contain/display the three data sources or other configurations capable of providing a simultaneous display of the three data sources, etc., as might be known by people who are skilled in the art.

It should be noted that speech intelligibility represents the degree to which speech can be understood. According to one embodiment of the invention, speech intelligibility is based on the modulation transfer function; according to another embodiment of the invention, speech intelligibility is based on the speech transmission index. In addition to depicting speech intelligibility graphically, the system may be configured to depict a poor level of speech intelligibility using color shading (e.g. brown, tan, etc.) of the model of the sound system, according to one embodiment of the invention.

Figure 3:
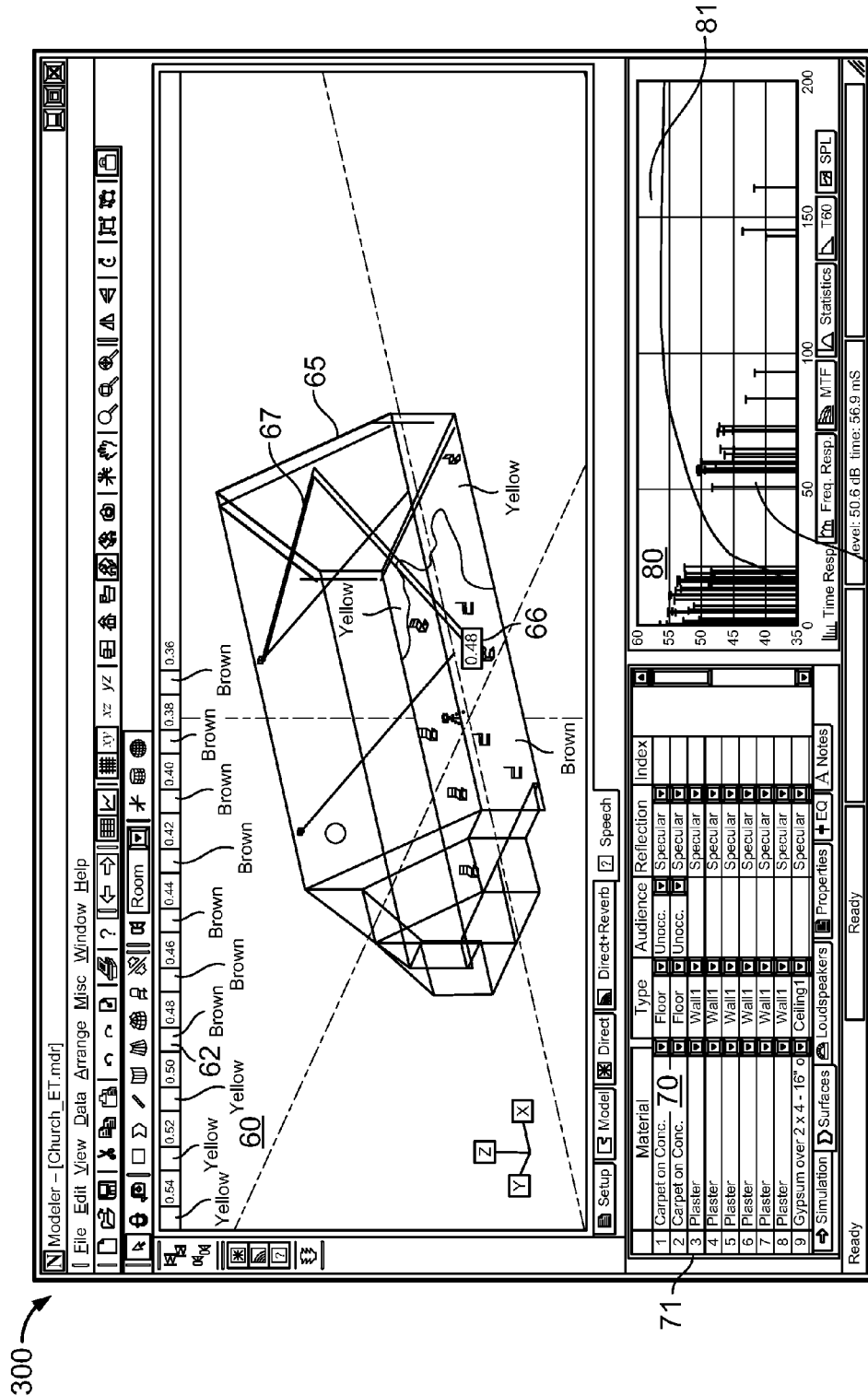
FIG. 3 shows the selection of an audio system component parameter, according to one embodiment of the invention.

For example, in the case of a sound system configuration in which poor speech intelligibility occurs (for example, if reflected sound arrives at the listening location at a time and at a level that interferes with intelligibility), a sound engineer is able to easily evaluate alternative sound system configurations in order to improve upon the sound system design. See FIG. 3. In the example, the display has three windows: a model window 60, a parameter window 70 and an attribute window 80. In the model window 60 showing sound system components 65, a depiction of the intelligibility calculated for each listening location 66 is overlaid over the sound system model, where intelligibility level is color mapped (e.g. better intelligibility is more-yellow; poorer intelligibility is more-brown) over the listening area. A cursor is present in the display 30 which selects a listening location 66 to be analyzed. Movement of the cursor across the sound system model selects different listening locations 66.

In the performance attribute window 80, the system 100 displays the calculated representative time response of the sound system at the listening location 66 selected by the cursor in the model window 60. Movement of the cursor in the model window 60 to a different listening location 66 causes a different representative time response to be displayed. Accordingly, the sound engineer can move the cursor to a location in the model window 60 that appears to have poorer intelligibility (e.g. as identified by the color map overlaid on the sound system model in the model window 60). The time response for that location is now visible in the performance attribute 80 window.

In the performance attribute window 80, a time response graph shows a series of pins corresponding to discrete sound arrivals (e.g. direct and reflected sound arrivals) at the selected listening location 66. The sound engineer selects a pin 82 of interest (e.g. one that the sound engineer is suspicious contributes to the poorer calculated intelligibility). In response, the system 100 displays a sound path in the model window representing the complete sound path associated with the sound arrival from its origin (e.g. a loudspeaker element, etc.) to the listening location 66.

After reviewing the system 100 display 30, the sound engineer can then decide how he would like to modify the sound system design (i.e. by either modifying an audio component or sound environment component 65 or component parameter 71 in some way, or adding or deleting sound system components) in order to improve the calculated intelligibility.

For example, the sound engineer may wish to see the effect of placing absorptive material on a section of a wall that the identified path intersects with. The sound engineer can select the wall surface in the model window. In turn, the system 100 displays component parameters 71 of that wall surface in the parameter window. He can then change the parameter to affect more absorption.

Other changes that a sound engineer may make to parameters include, for example: changing orientation of loudspeakers, adding or removing loudspeakers, adjusting signal processing applied to one or a combination of loudspeakers, or changing aspects of the sound system model, such as locations of reflective surfaces, material properties of surfaces such as reflective type (specular, diffuse, etc.), or absorptive characteristics as a function of frequency.

After the sound engineer modifies parameters 71 representing the absorption characteristics of the wall, the system 100 immediately begins calculating new results, as described in more detail below. When calculations are complete, the new intelligibility color map is overlaid on the sound system model (i.e. model of the sound system) in the model window 60, and new time response data is shown in the performance attributes window 80. Should the sound engineer desire to change a number of different parameters 71, calculations are restarted each time a new parameter 71 is entered, as described in more detail below. The sound engineer is able to quickly see the effects of the component parameter 71 change(s) on sound system performance. Repeated iterations of component parameter 71 changes can be attempted until a desirable configuration has been identified.

The process of making component parameter 71 changes is aided by the earlier described features of the system 100 in which, upon the user/sound engineer selection of a particular sound system component 65, the corresponding component parameter 71 is highlighted, or alternatively, upon selecting or highlighting or identifying a component parameter of the system by the user, the system highlights or identifies the associated sound system component.

Just as the system enables analysis of the sound system by overlaying a color depiction of sound system intelligibility over the sound system model, the same overlay method/mechanism is also used by the system 100 for analysis of sound pressure level, reverberation time, etc. of direct and reverberant sound.

Figure 4:
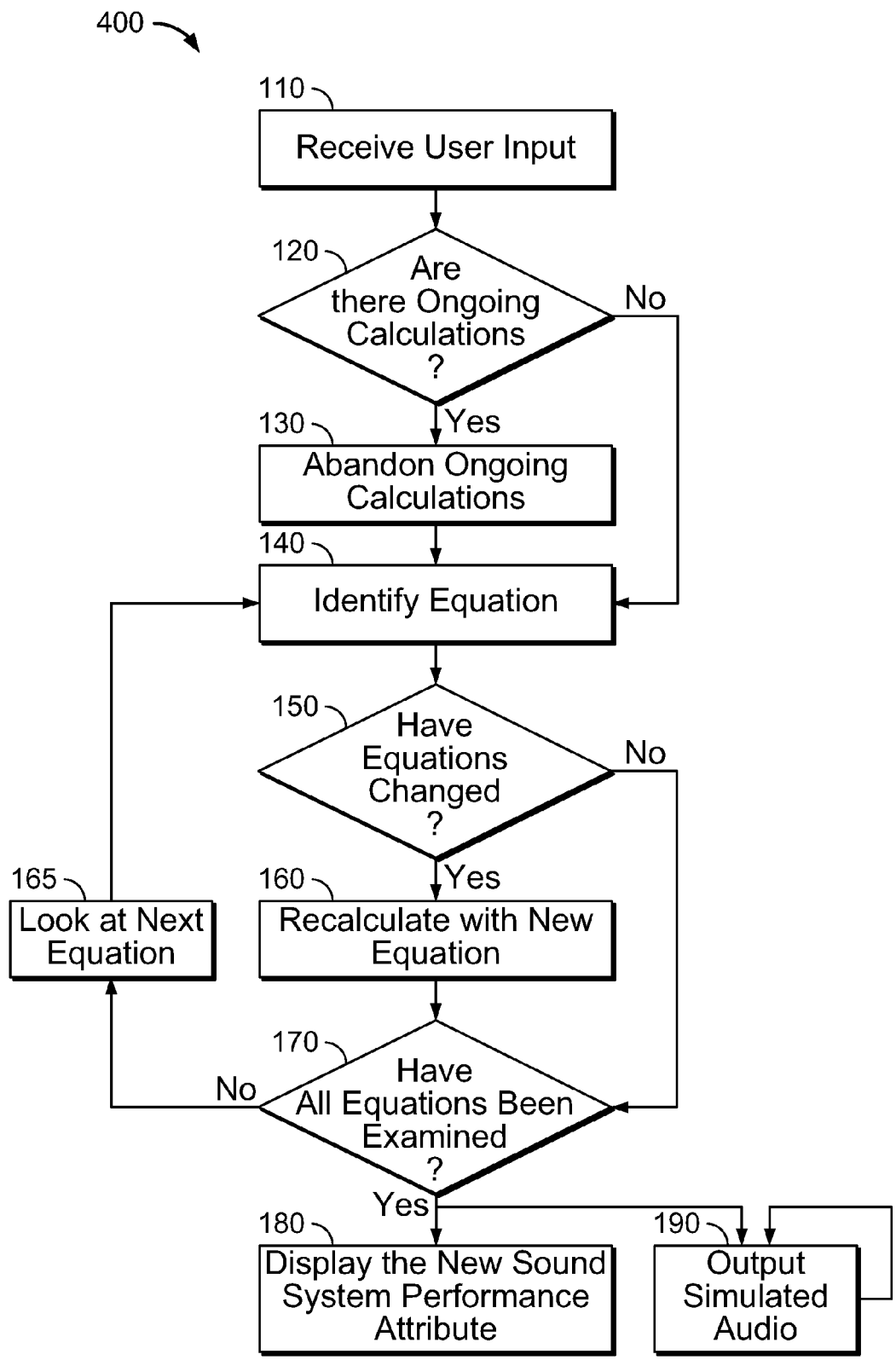
FIG. 4 is a flow chart of a procedure for designing audio systems, according to one embodiment of the invention.

FIG. 4 is a flow chart 400 for operation of a configuration processor for designing audio systems, according to one embodiment of the invention. The procedure provides a method that simplifies the process for conducting multiple iterations of design modifications and performance assessment. By reducing the time element for evaluating alternative design configurations, sound engineers are able to more finely tune a sound system design. Initially, in step 110, the system 100 receives user input to modify a sound system component 65 or component parameter 71.

In step 120, system 100 checks to see if there are any ongoing calculations operating as a result of earlier user inputs. If earlier calculations are being performed, in step 130, system 100 abandons any calculations that are no longer needed. For example, calculations may be ongoing if a sound engineer has performed a rapid succession of modifications to the sound system components 65 and/or component parameters, etc. If no calculations are on going, the system proceeds to step 140.

The system 100 is set-up in such a fashion as to reduce the likelihood of unnecessary computations by virtue of its configuration in which only those calculations that depend on changes to sound system components 65 and/or component parameters 71 etc. are performed. The calculations performed are calculations of performance attributes based on equations that relate in some manner to the various sound system components 65 and component parameters 71 of the sound system model. The equations contain variables, coefficients, and modifiers or operators (equation elements) that depend on the sound system components 65 and component parameters 71.

In step 140, an equation is identified. When a change 110 is made to a sound system component 65 or component parameter 71, an element of an equation that depends in some way on the changed sound system 65 component or component parameter 71 may change. In cases where a sound system component 65 is added or deleted, elements related to the added or deleted sound system component 65 may be added or removed or re-arranged in existing equations, or entirely new equations may be formed to represent the changed sound system model.

In step 150, the selected equation is examined to see if any variable, coefficient or equation element has changed. An equation will be calculated (or re-calculated) in step 160 after a change is made to a sound system component 65 or component parameter 71 (i.e. a user data input is accepted) if any element in the equation changes as a result of the sound system component 65 or parameter 71 change. The equation will also be calculated (or re-calculated) if it depends in some manner on another equation whose calculated result has changed (or will change) as a result of the user input received. The equation identified will not be calculated (or re-calculated) if no change to any element (variable or coefficient) in the identified equation occurs, and if it does not depend on a calculated result from another equation that has changed as a result of the user input received. In step 170, if all equations have not been examined, the system 100 then looks at the next equation 165, and repeats the process until all equations representing the sound system model have been examined.

After the equations are all examined, the system 100 displays 180 new sound system performance attributes in the attributes window 80, and/or outputs simulated audio signals 190. Although the process has been described here using an example of an iterative loop where each equation is examined one at a time, artisans skilled in the art will appreciate that there are numerous ways in which the system 100 can be configured to perform the function described. For example, a larger subset of equations, or even all equations, could be examined at once, before calculation or re-calculation of any equations are performed.

For example, for a particular sound system model and a particular listening location, assume we are interested in the representative time response (e.g. represented as pins 82, as described earlier). If we examine each individual pin 82, it may be the case that for all sound paths for all pins in the time response, a particular room surface is never intersected. If a sound engineer were to change the material property of the non-intersected surface, for example, there would be no effect on the time response of interest. The program would not re-perform calculations related to the specific time response shown, if that particular surface's material properties were changed, because the room parameter changed was not used in the calculation of the response in question. Alternatively, if the sound engineer changed the material properties of an intersected wall surface, the calculations related to the specific time response shown would be performed.

This same process for example, also applies to calculation of each individual pin in a particular representative time response. For example, the equations used to calculate a particular pin, which is associated with a particular sound path, will not depend on parameters of a particular wall surface if the sound path identified with the pin of interest does not intersect that wall surface. In this case, the equations associated with this particular pin of the representative time response will not be calculated (or re-calculated).

The equation calculations/re-calculations, as described above, may be performed in the background according to one embodiment of the invention. Accordingly, the system 100 is configured to perform calculations/re-calculations uninterrupted by any simultaneously-performed input/output operations of the user interface. The system 100 services the user interface so that the program always appears responsive even during a time that the program is processing calculations of sound performance attributes in the attributes window 80.

In addition to depicting sound system performance (e.g. in the form of performance attributes, etc. 80), the system 100 also acts as a configuration simulator (e.g. an integrated subsystem of the system 100 performs the configuration simulator function). System 100 is configured to output audio signals that simulate, for a selected listening location, the actual sound that a sound system operating in the given sound system environment would produce at the selected listening location. In order to conduct such a simulation, the processor 20 filters an audio signal provided by an audio source, where the transfer functions of the filtering applied model the transfer functions from the various audio components to a listener's ears, when the listener is seated in the selected listening location. The filters are typically implemented as digital filters (usually as FIR filters), where the coefficients of the filter determine the filter transfer function. The filtered signals can be applied to an output mechanism 40 (e.g. loudspeaker(s)), so that they can be rendered into audible signals for evaluation by the sound system designer. The calculated filtering should also take into account the transfer functions of the playback system 40, so that the resulting rendered signals at the listener's ears properly reflect the signals that would be present if the listener were located in the identified listening position in the real acoustic space that is being simulated. The simulated audio signals 41 (shown in FIG. 1), so provided, enable the user by listening to evaluate the effectiveness of the sound system configuration. The system is also configured to simultaneously displays a graphic representation of the performance attribute(s) and sound system components 65 associated with the simulated audio signal 41.

The process of simulating for a user sound one would expect to hear if the user were physically located in an identified position in a room represented by a sound system model, is referred to as auralization. There are many known methods for constructing filtered signals to be used for auralization. A discussion of auralization techniques can be found for example, in the Audio Engineering Society Preprint; 3119 (C-1) AES 91$^{st}$ Convention Oct. 4-8, 1991. The simulation system of the current invention is compatible with any of the known auralization techniques.

Upon reception of an input from a user changing a sound system component or parameter, system 100 begins calculation of sets of new filter coefficients, for each identified listening location. The process described earlier for calculation (or re-calculation) of equations representing performance attributes of the sound system model are also applicable to calculation of coefficients for the filter sets associated with identified listening locations.

The system 100 provides a mechanism for user evaluation of multiple listening locations, where the locations may all be within a single sound system configuration, or may be distributed across multiple alternative sound system configurations which are stored in the system 100 storage device 50. The mechanism allows the user to play multiple simulated signals in sequence for rendering and evaluation. In that way the system 100 provides a mechanism for conducting listener comparison of various listening locations within a single sound system configuration. Additionally, system 100 allows the user to make comparisons between multiple different sound system configurations, which improves the ability of the user to evaluate different possible sound system designs. Accordingly, as shown in step 190 of FIG. 4, the sound system plays back simulations of listening locations from one or more stored (e.g. stored in storage device 50) sound system configurations.

The system 100 provides a variety of playback controls to assist the user/sound engineer in performing comparison and evaluation of the effectiveness of alternative sound system configurations. For example, in FIG. 5 a list 500 of listener positions 66 is shown. The listening locations shown in list 500 are selected by the user as part of the initial input of data (components, parameters, etc.) used to construct the sound system model. The list could also be updated at a later time by the user if desired. Filter coefficients for filters used to perform audible simulations for each of these identified listening locations are calculated and stored by system 100. Accordingly, individual simulated audio signals 41 may be played back sequentially based on user selection of listening positions 66.

Figures 5, 6:
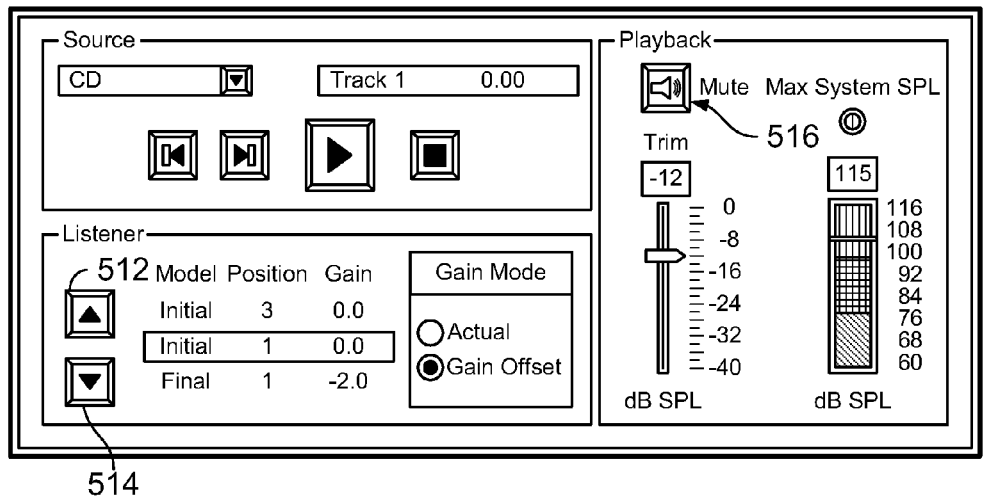
FIG. 5 shows a list of listener positions for user selection, according to one embodiment of the invention.
FIG. 6 shows a playback control window, according to one embodiment of the invention.

FIG. 5 shows exemplary unselected listening position 502 check boxes and selected listening position 504 check boxes. Selecting or unselecting listening positions using associated check boxes either adds or subtracts listening locations from the list of listening positions to be rendered and evaluated.

FIG. 5 also shows a sample tool check box 501. In addition to the already-established listening positions 66 that a user defines during the initial configuration of the sound system model, the system 100 provides a way to designate an additional listening position for playback, on-the-spot. Accordingly, the user may designate such an impromptu listening position (i.e. sample listening position) by clicking a sample tool cursor on a desired sample listening location in the system model. Later, by clicking on the sample tool list check box 501, a user may include the sample listening position in the list 500 of audio signals 41 for playback. Upon playback, the system 100 loads any files (e.g. sets of filter coefficients) needed for simulation and playback of the audio signals 41.

Additional features of the invention also include the ability to playback all or a portion of the list of the simulated signals in forward or reverse order of the list 500 of listening positions. According to one embodiment of the invention, system 100 incorporates playback control window 550 as shown in FIG. 6. Playback control window 550 includes control buttons 512, 514 for controlling the order in which audio simulations are performed. Playback control window 550 also includes mute control 516, for disabling an audio simulation. Playback control window 550 may also contain other controls for controlling audible simulation such as gain, volume, play, stop, etc.

Thus, as described in detail, above, embodiments of the invention provide methods and mechanisms for assisting in the process for designing audio systems. While this invention has been particularly shown and described with references to preferred embodiments thereof, it will be understood by those skilled in the art that various changes in form and details may be made therein without departing from the spirit and scope of the invention, as defined by the appended claims.

For example, arrangements of embodiments of the invention that are disclosed herein include a computer program product that has a computer-readable medium including computer program logic encoded thereon. When executed on at least one processor, the computer program product causes the processor to perform the operations (e.g., the methods) indicated herein as embodiments of the invention. The methods embodiments of the invention may be implemented by computer software and/or hardware mechanisms within a media or communications apparatus. It is to be understood that, in addition to the embodiments described above, the system 100 of the invention can be embodied strictly as a software program, as software and hardware, or as hardware alone.

What is claimed is:

1. A method for simulating sound system performance using a configuration simulator, comprising the steps of:
   specifying a sound system configuration comprising sound system components;
   simulating, based on the sound system configuration, the sound a user would expect to hear if the user were physically located in an identified listening position in a sound system model associated with the sound system configuration;
   without performance of additional set-up operations, playing back the simulation result through an output device, for evaluation by a listener;
   computing a sound system performance attribute based on at least the first parameter, the attribute comprising a representative time response having at least one reflected sound identifier; and
   displaying:
   1) a visual representation of the sound system model, the sound system comprising at least a first one of the sound system components,
   2) at least a first parameter associated with the first sound system component, and
   3) a graphic representation of the computed sound system performance attribute
   4) superimposed over the visual representation of the sound system model, a colored map in which different colors of the colored map each represent a different level of favorableness of the sound system performance attribute and wherein the system uses one color for the desirable sound pressure level in the middle of the sound pressure level scale and a second color for the undesirable sound pressure level, found at both ends of the sound pressure level scale; and
   wherein the second color represents both the high and low ends of the sound system performance attribute scale.

2. The method of claim 1 further comprising the steps of:
   accepting a user selection of a reflected sound identifier; and
   displaying a graphic representation in the sound system model of a sound path associated with the selected reflected sound identifier.

3. The method of claim 1 further comprising the steps of:
   superimposing, over the sound system model, a colored map in which different colors of the colored map each represent a different level of favorableness of a sound system performance attribute.

4. A method for simulating sound system performance using a configuration simulator, comprising the steps of: specifying a sound system configuration comprising sound system components; simulating, based on the sound system configuration, the sound a user would expect
   to hear if the user were physically located in an identified listening position in a sound system model associated with the sound system configuration;
   without performance of additional set-up operations, playing back the simulation result through an output device, for evaluation by a listener;
   computing a sound system performance attribute based on at least the first parameter, the attribute comprising a representative time response having at least one reflected sound identifier; and
   displaying:
   1) a visual representation of the sound system model, the sound system comprising at least a first one of the sound system components,
   2) at least a first parameter associated with the first sound system component,
   3) a graphic representation of the computed sound system performance attribute, and
   4) overlaying color mapped intelligibility data overlaid on the displayed visual representation of the sound system model, wherein the different colors of the colored mapped intelligibility data each represent a different level of favorableness of the sound system performance attribute and wherein the system uses one color for the desirable sound pressure level in the middle of the sound pressure level scale and a second color for the undesirable sound pressure level, found at both ends of the sound pressure level scale; and
   wherein the second color represents both the high and low ends of the sound system performance attribute scale.

5. The method of claim 4 further comprising the steps of:
   identifying, based on the color mapped intelligibility data, a location in the sound system model with poor intelligibility,
   selecting by the user the location with poor intelligibility,
   computing the representative time response associated with the selected location; and
   displaying, without further action by the user, the computed representative time response.

6. A method for simulating sound system performance using a configuration simulator, comprising the steps of:
   specifying a sound system configuration comprising sound system components;
   simulating, based on the sound system configuration, the sound a user would expect to hear if the user were physically located in an identified listening position in a sound system model associated with the sound system configuration;
   without performance of additional set-up operations, playing back the simulation result through an output device, for evaluation by a listener;
   computing a sound system performance attribute based on at least a first parameter associated with a first one of the sound system components; and
   displaying:
   1) a visual representation of the sound system model, the sound system comprising at least the first sound system component,
   2) at least the first parameter associated with the first sound system component,
   3) a graphic representation of the sound system performance attribute=
   and 4) superimposed over the visual representation of the sound system model, a colored map in which different colors of the colored map each represent a different level of favorableness of the sound system performance attribute and wherein the system uses one color for the desirable sound pressure level in the middle of the sound pressure level scale and a second color for the undesirable sound pressure level, found at both ends of the sound pressure level scale; and wherein the second color represents both the high and low ends of the sound system performance attribute scale.

7. The method for simulating sound system performance of claim 6 wherein the step of displaying further comprises highlighting a portion of the sound system model associated with the identified listening position.

8. The method for simulating sound system performance of claim 6 wherein the step of displaying further comprises the step of displaying a list of user-defined listening positions for which audio simulations may be performed.

9. The method for simulating sound system performance of claim 8, wherein the step of playing back further comprises playing back simulation results in an order determined by the user.

10. The method for simulating of claim 8 wherein the step of displaying further comprises the step of:

selecting an impromptu listening location in the sound system model; and adding the impromptu listening location to the list of user-defined listening positions.

11. The method for simulating of claim 6 further comprising the step of:

inputting an audio signal from an audio source;

wherein the simulating of the sound a user would expect to hear comprises filtering the audio signal using filter coefficients associated with the sound system configuration, the filter coefficients determining the frequency response of a filter.

12. The method of claim 6 further comprising the steps of:

receiving input from the user, wherein the input modifies one of: a second one of the sound system components and a parameter associated with the second sound system component;

calculating an updated sound system performance attribute; and displaying, in response to the user input received, without additional user intervention, the updated sound system performance attribute.

13. The method of claim 12, wherein in the step of calculating the updated sound system performance attribute, the updated sound system performance attribute depends on the user input.

14. The method of claim 12, wherein the step of calculating the updated sound system performance attribute is performed in the background.

15. The method of claim 12, wherein the step of calculating the updated sound system performance attribute of the sound system is abandoned upon receipt of a new input from the user.

16. The method of claim 6 further comprising the step of, in response to user-selection of the first or a second parameter, identifying to the user a sound system component associated with the selected parameter.

17. The method of claim 6 further comprising the step of, in response to user selection of the first or a second sound system component, identifying to the user a parameter associated with the selected sound system component.

18. The method of claim 12 further comprising, in response to the user input modifying the second sound system component, the step of translating the user modification of the second sound system component into a changed parameter.

19. The method of claim 18 wherein the user modification to the sound system component comprises dragging the sound system component to a new location on the display screen.

20. The method of claim 6 wherein the sound system model has a plurality of listening positions, the method further comprising the steps of:

accepting user selection of a listening position;

calculating a second sound system performance attribute associated with the selected listening position; and displaying a graphic representation of the second sound system performance attribute.

21. The method of claim 20 wherein the second sound system performance attribute comprises one of:

direct sound pressure level as a function of frequency, reverberant sound pressure level as a function of frequency, intelligibility, representative time response, modulation transfer function, and reverberation time.

22. An integrated configuration simulation device comprising:

a storage device, for storing a pre-defined sound system configuration, the sound system configuration comprising sound system components;

a processor configured to— simulate, based on the stored sound system configuration, the sound a user would expect to hear if the user were physically located in an identified listening position in a sound system model associated with the sound system configuration, and compute a sound system performance attribute based on at least a first parameter associated with a first one of the sound system components;

an output device, wherein the processor is configured to playback the simulation result through the output device for evaluation by a listener without performance of additional set-up operations; and a display, wherein the processor is configured to output to the display:

1) a visual representation of the sound system model, the sound system comprising at least the first sound system component, 2) at least the first parameter associated with the first sound system component, 3) a graphic representation of the sound system performance attribute= and 4) superimposed over the visual representation of the sound system model, a colored map in which different colors of the colored map each represent a different level of favorableness of the sound system performance attribute and wherein the system uses one color for the desirable sound pressure level in the middle of the sound pressure level scale and a second color for the undesirable sound pressure level, found at both ends of the sound pressure level scale; and wherein the second color represents both the high and low ends of the sound system performance attribute scale.

23. The simulation configuration device of claim 22 further comprising an input for receiving an audio signal from an audio source, and wherein the processor comprises a filter configured to filter the audio signal, wherein the filter has coefficients associated with the sound system configuration, the coefficients determining the frequency response of the filter.

24. An integrated configuration simulation device comprising:
- a storage device, for storing a pre-defined sound system configuration, the sound system configuration comprising sound system components;
- a processor configured to:
- simulate, based on the stored sound system configuration, the sound a user would expect to hear if the user were physically located in an identified listening position in a sound system model associated with the sound system configuration, and
- compute a sound system performance attribute based on at least the first parameter, the attribute comprising a representative time response having at least one reflected sound identifier;
- an output device, wherein the processor is configured to playback the simulation result through the output device for evaluation by a listener without performance of additional set-up operations; and
- a display, wherein the processor is configured to output to the display:
  1) a visual representation of the sound system model, the sound system comprising at least a first one of the sound system components,
  2) at least a first parameter associated with the first sound system component,
  and
  3) a graphic representation of the computed sound system performance attribute, and
  4) superimposed over the visual representation of the sound system model, a colored map in which different colors of the colored map each represent a different level of favorableness of the sound system performance attribute and wherein the system uses one color for the desirable sound pressure level in the middle of the sound pressure level scale and a second color for the undesirable sound pressure level, found at both ends of the sound pressure level scale; and
- wherein the second color represents both the high and low ends of the sound system performance attribute scale.

* * * * *

UNITED STATES PATENT AND TRADEMARK OFFICE
CERTIFICATE OF CORRECTION

| | |
|---|---|
| PATENT NO. | : 7,643,640 B2 |
| APPLICATION NO. | : 10/964421 |
| DATED | : January 5, 2010 |
| INVENTOR(S) | : Jorgensen et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1366 days.

Signed and Sealed this

Sixteenth Day of November, 2010

David J. Kappos
*Director of the United States Patent and Trademark Office*